(12) United States Patent
Madrid et al.

(10) Patent No.: US 7,576,429 B2
(45) Date of Patent: Aug. 18, 2009

(54) PACKAGED SEMICONDUCTOR DEVICE WITH DUAL EXPOSED SURFACES AND METHOD OF MANUFACTURING

(75) Inventors: Ruben P. Madrid, Lapu-lapu (PH); Romel N. Manatad, Mandaue (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 177 days.

(21) Appl. No.: 11/364,399

(22) Filed: Feb. 28, 2006

(65) Prior Publication Data

US 2007/0161151 A1  Jul. 12, 2007

Related U.S. Application Data

(60) Provisional application No. 60/755,241, filed on Dec. 30, 2005.

(51) Int. Cl.
*H01L 23/34* (2006.01)

(52) U.S. Cl. .................. 257/718; 257/678; 257/692; 257/696; 257/726; 257/727

(58) Field of Classification Search .................. 257/678, 257/667, 670, 672, 673, 675, 676, 692–696
See application file for complete search history.

(56) References Cited

U.S. PATENT DOCUMENTS

| | | | |
|---|---|---|---|
| 6,521,982 B1 | 2/2003 | Crowley et al. | |
| 6,756,658 B1 | 6/2004 | Gillett et al. | |
| 6,777,786 B2 * | 8/2004 | Estacio | 257/666 |
| 6,777,800 B2 * | 8/2004 | Madrid et al. | 257/690 |
| 6,870,254 B1 | 3/2005 | Estacio et al. | |
| 6,891,256 B2 | 5/2005 | Joshi et al. | |
| 2004/0232545 A1 | 11/2004 | Takaishi | |
| 2005/0001293 A1 | 1/2005 | Estacio | |

OTHER PUBLICATIONS

International Searching Authority; International Search Report and Written Opinion; Mailed Apr. 1, 2008 in PCT/US06/62695 (12 pages).

* cited by examiner

*Primary Examiner*—Jasmine J Clark
(74) *Attorney, Agent, or Firm*—Thomas R. FitzGerald, Esq.; Robert D. Lott, Esq.; Hiscock & Barclay, LLP

(57) ABSTRACT

The invention claimed is a packaged semiconductor device with dual exposed surfaces and a method of manufacturing the device. A thermal clip and one or multiple source pads are exposed on opposite ends of the device through a nonconductive molding material used to package the device. The thermal clip and source pad can be either top or bottom-exposed. The gate, source and drain leads are exposed through the molding material, and all leads are coplanar with the bottom-exposed surface. The device can have multiple semiconductor dies or various sized dies while still having a single, constant footprint. The method of manufacturing requires attaching the semiconductor die to a thermal clip, and then attaching the die with the attached thermal clip to a lead frame. The resulting device is then molded, marked, trimmed and singulated, in this order, creating a packaged semiconductor device with dual exposed surfaces.

7 Claims, 10 Drawing Sheets

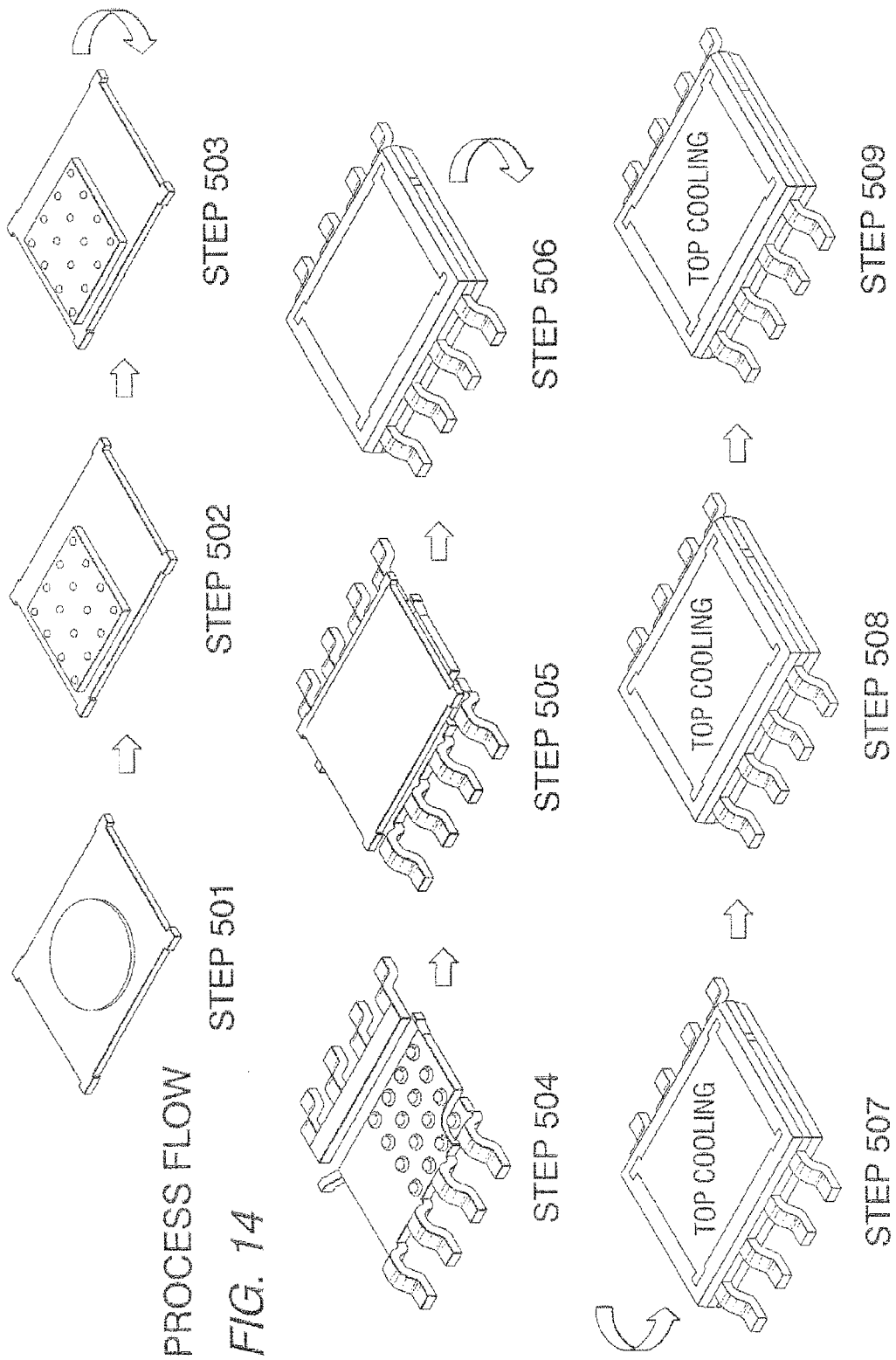

PACKAGED SEMICONDUCTOR DEVICE WITH DUAL EXPOSED SURFACES AND METHOD OF MANUFACTURING

CROSS-REFERENCE TO RELATED APPLICATIONS

This application claims the benefit of U.S. Provisional Patent Application No. 60/755,241 filed Dec. 30, 2005.

BACKGROUND OF THE INVENTION

Semiconductor devices are used in many consumer electronic products such as cell phones and laptop computers. However, before use the semiconductor must be designed such that they conform to the space allotted in the product in which they are used, as well as deal with other issues arising from the operation of the device itself.

First, it is desirable to remove heat from the semiconductor die while it is in operation, since the die will generate heat during operation. Heat dissipation is desirable because heat can lower efficacy of the die or even fatally affect the device. Thermal clips have been attached to semiconductor dies to act as a natural heat sink, however improved methods of dissipating heat or cooling the die are desirable.

Second, versatility in attachment to printed board circuits is desired. Since consumer products are becoming smaller in size the need for versatility in semiconductors is greater. Creation of packaged semiconductor devices having reversible mounting capabilities to printed circuit boards (PCBs) is desirable. Further, packaged semiconductor devices with the same footprint, which can incorporate differing die sizes or multiple dies, are desirable. Electronic products can vary in the degree of capabilities, requiring different semiconductor dies or even multiple dies but with the same footprint for manufacturing. Thus, a packaged device that allows for differing die sizes or multiple dies with the same footprint is desired. The invention addresses the aforementioned problems as well as others, in separate embodiments collectively and separately.

SUMMARY OF THE INVENTION

The embodiments of the invention are directed to a packaged semiconductor device and a method for making the packaged device.

The invention is directed to a semiconductor device comprising: (a) at least one semiconductor die comprising a first surface, a second surface, and a vertical transistor with at least one control region and at least one first terminal region at said first surface, and a second terminal region at said second surface; (b) a thermal clip with a first surface and a second surface wherein said second surface is connected to said drain region of said semiconductor die; (c) at least one first terminal pad structure with a first surface, a second surface, and at least one source lead extending from one side of said first terminal pad structure, wherein said first terminal region of said semiconductor die is connected to said first surface of said first terminal pad structure; (d) at least one control pad structure with a first surface, a second surface, and at least one control lead extending from one end of said control pad structure, wherein said control region of said semiconductor die is connected to said first surface of said control pad structure; (e) at least one second terminal pad structure with a first surface, a second surface, and at least one second terminal lead extending from one end of said second terminal pad structure, wherein said first surface of said second terminal pad is connected to said second surface of said thermal clip; and (f) a nonconductive molding material encapsulating said semiconductor die, wherein said first surface of said thermal clip and said second surface of said first terminal pad structure are exposed through said nonconductive molding material, and wherein said control lead, said first terminal lead and said second terminal lead are exposed through said nonconductive molding material.

The first embodiment includes a mosfet. The embodiment includes a top-exposed thermal clip and a bottom-exposed source pad with one semiconductor die having one gate, source and drain region oriented so that the regions of the semiconductor die are in contact with the corresponding structure (e.g. the source region of the die is attached to the source pad). Further, the source, gate and drain leads are all coplanar with the bottom-exposed source pad.

The second embodiment is similar to the first embodiment, but with a top-exposed source pad and bottom-exposed thermal clip wherein the source, gate and drain leads are all coplanar with the thermal clip.

The third embodiment, again having a mosfet, of the device contains a semiconductor die having two source regions and two gate regions. Therefore, there is a need for two source pads, being top-exposed and two gate pads attached to the appropriate regions of the die. The gate, source and drain leads are all coplanar with the bottom-exposed thermal clip.

The fourth embodiment of the device is a top-exposed thermal clip with a semiconductor die having two source and gate regions, thereby requiring two source and gate pads for attachment to the die. The source, gate and drain leads of this embodiment are coplanar with the bottom-exposed source pads.

All of these embodiments are packaged with a nonconductive molding material encapsulating the semiconductor device to protect it from outside contaminants and environmental factors. These embodiments are not exhaustive of the embodiments of the packaged device. It is possible to use multiple semiconductor dies in this invention. Further, it is possible for the transistor to be a bipolar vertical transistor. The constant feature, however, of this is device is a footprint, comprised of: (1) the control and first terminal leads, (2) either a thermal clip or first terminal pad that is bottom-exposed, and (3) second terminal leads.

The invention is also directed to the method of making these devices, comprising: (a) providing at least one semiconductor die comprising a first surface, a second surface, and a vertical transistor having at least one control region and at least one first terminal region at said first surface and a second terminal region at said second surface; (b) providing a thermal clip with a first surface and a second surface; (c) providing a lead frame array in matrix format, said lead frame comprising at least one first terminal pad structure with at least one first terminal lead extending from one side of said first terminal pad structure; at least one control pad structure with at least one control lead extending from one end of said control pad structure; at least one second terminal pad structure with at least one second terminal lead extending from one end of said second terminal pad structure, wherein said lead frame has a first surface and a second surface; (d) providing a nonconductive molding material; (e) attaching said second terminal region of said semiconductor die to said second surface of said thermal clip; (f) attaching said control region of said semiconductor die to said first surface of said control pad structure and said first terminal region to said first surface of said first terminal pad structure in said lead frame; (g) attaching said second surface of said thermal clip to said first surface of said second terminal pad structure in said lead frame; and (h) encapsulating said semiconductor die, said thermal clip and said lead frame with said nonconductive molding material, wherein said first surface of said thermal clip and said first terminal pad structure on said second surface of said lead frame and said control lead, said first terminal leads and said second terminal leads are exposed through the molding material.

The invention has a number of advantages over the prior art. First, the invention expects high thermal capacity because both sides of the packaged semiconductor device are exposed. Exposure of the thermal clip provides for a natural heat sink in the packaged device. Exposing both the thermal clip and source pad allows the semiconductor to cool naturally while it is in operation, providing for improved thermal capacity. Second, both sides of the packaged device can be attached to a PCB. Third, the packaged semiconductor can incorporate different sized semiconductor dies or even multiple dies and still have the same footprint. Fourth, the manufacturing process of the device is simpler in that pre-plated lead frames may be used, as opposed to plating the lead frames during manufacturing. Lastly, the device is flexible to both copper bumping and electroless nickel gold bumps.

BRIEF DESCRIPTION OF THE DRAWINGS

FIG. 14 shows the process flow of a method of manufacturing the packaged semiconductor device.

DETAILED DESCRIPTION

The invention is directed to a packaged semiconductor device. The device includes a semiconductor die, such as a flip chip, having one surface with at least one gate and source region and on the opposing surface a drain region. The semiconductor die may have protrusions on the source/gate surface which couples the flip chip to a surface of a die attach pad in a lead frame or more specifically to the source and gate pads. The drain region of the flip chip is attached to one surface of the thermal clip. The device can either have a top-exposed or thermal clip or source pad, and will have a bottom-exposed source pad or thermal clip, respectively. This assembled device is then covered by a non-conductive molding material, such as plastic resin. The molding material is necessary to protect the flip chip from contaminants or other factors within its environment and also electrically isolates certain parts within the device (e.g. the gate pad from the source pad). However, the gate, source and drain leads are exposed through the molding material as are the external surfaces of the source pad and thermal clip whether they are top or bottom exposed. The leads are coplanar with the bottom-exposed surface whether it is a source pad or thermal clip.

There are several advantages of the packaged semiconductor device. The exposure of the thermal clip and the source pad provides for high thermal capacity, which provides for a cooling mechanism for the die while it is operating. Also, the invention can have embodiments with different size semiconductor dies or multiple dies, and still have the same footprint. Accommodations can be made for the type or quantity of semiconductor dies without sacrificing the package shape, and thus allowing for conformity in the manufacture of the end product in which the packaged semiconductor is used. Further, this invention is comparable in shape to 8-pin small outline package (Std S08) and loss free package (FLPAK) devices.

Figure 1:
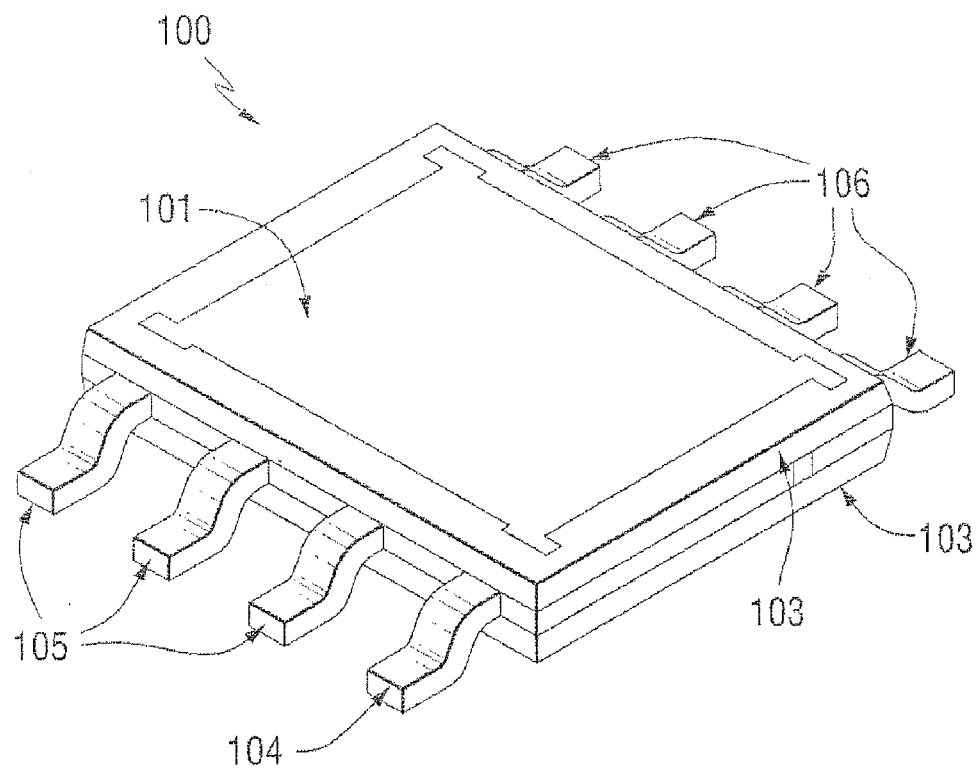
FIG. 1 shows a top perspective of a plan view of the top-exposed thermal clip packaged semiconductor device.
Figure 2:
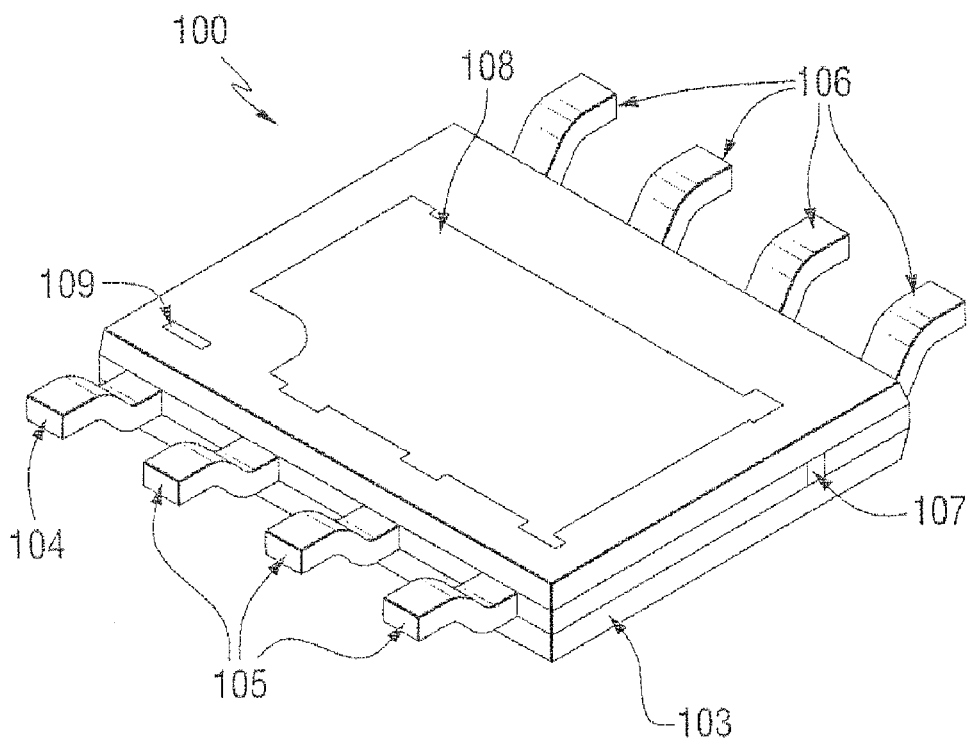
FIG. 2 shows a bottom perspective of a plan view of the top-exposed thermal clip packaged semiconductor device.

FIGS. 1-13a show several embodiments of the invention and FIG. 14 shows a method of manufacturing the device. A first embodiment is shown in FIGS. 1 and 2 of a packaged semiconductor device with a top-exposed thermal clip 100, using a flip chip as the semiconductor die. The device includes a thermal clip 101, a gate lead 104, source leads 105, drain leads 106, a source pad 108, a gate pad 109, and non-conductive molding material 103. The thermal clip 101 and the source pad 108 each have one surface exposed through the nonconductive molding material 103. The gate pad 109, although exposed through the molding material 103, is covered by nonconductive ink. Referring to FIG. 2, the gate lead 104 and source leads 105 are exposed laterally through the molding material 103 on the left side of the packaged semiconductor 100, and drain leads 106 are laterally exposed on the right side through molding material 103.

FIGS. 1 and 2 show only one gate lead 104, three source leads 105, and four drain leads 106. There are other embodiments that have multiple source and gate leads with each lead attached to an individual source or gate pad. The gate lead 104 and source leads 105 are in a gull-wing shape so that the leads 104, 105 are coplanar with the bottom-exposed source pad 108. An important feature of the invention is the coplanar nature of the gate lead 104, source lead 105 and drain lead 106 with the source pad 108, so as to make a footprint. The creation of a single footprint is significant for manufacturing purposes with respect to other devices in which the semiconductor is used.

Figure 3:
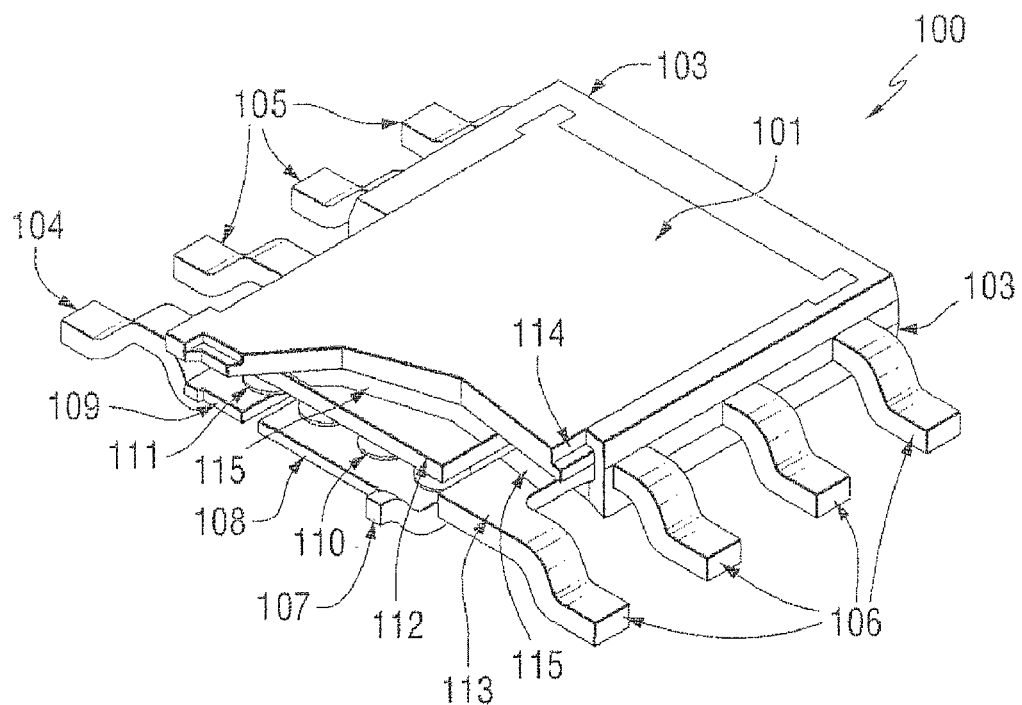
FIG. 3 shows a top view of the top-exposed thermal clip packaged semiconductor device with the molding material and thermal clip partially removed exposing the semiconductor die.
Figure 4:
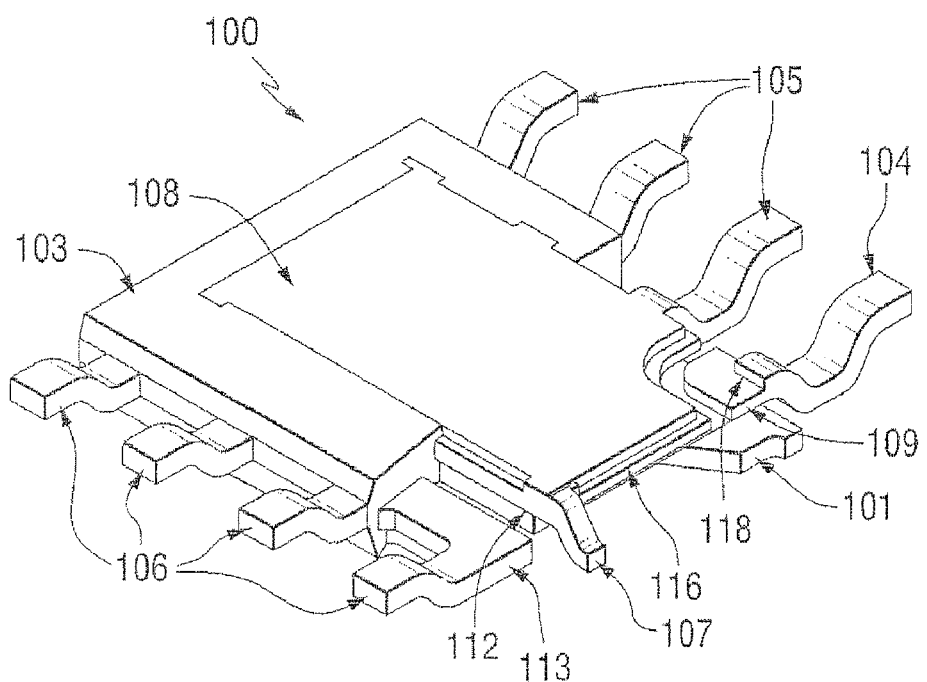
FIG. 4 shows a bottom view of the top-exposed thermal clip packaged semiconductor device with the molding partially removed.

FIGS. 3 and 4 show a cut-away view of both the top and bottom of the packaged semiconductor 100 in this first embodiment. A feature that can be seen from this view is the half-etching 114, 116 on both the thermal clip 101 and the source pad 108. The half-etching 114 around the thermal clip 101 locks the nonconductive molding material 103. Similarly, the half-etching 116 around the source pad 108 locks the nonconductive molding material 103 to the device, thereby creating the packaged semiconductor device 100.

Looking inward from the cut-away view in FIG. 3, a layer of solder paste 115 connects the thermal clip 101 to the drain region of the flip chip 112. The flip chip 112 has a drain region on one side with the opposing side housing the source and gate regions. The flip chip 112 in this first embodiment shows a drain region facing the unexposed surface of the thermal clip 101. The drain pad 113 is also attached by solder paste 115 to the unexposed surface of the thermal clip 101. The flip chip 112 has a number of bumps protruding from both the gate and source regions, covered by solder paste which creates a secure connection between the source pad 108, gate pad 109 and flip chip 112. In this first embodiment there is one gate bump 111 and several source bumps 110 each protruding from the gate region and source region of the flip chip 112, respectively. The gate bump 111 and gate pad 109 and the source bumps 110 and source pad 108 are respectively attached by solder paste.

Further, a tie bar 107 is protruding from the source pad 108. The tie bar 107 connects the source pad to the lead frame. Generally, the lead frame is utilized in manufacturing. The lead frame houses the source, gate and drain leads and pads or a die attach pad and leads. These lead frames are in an array format where they are all interconnected by tie rails. The tie rails run parallel to each other with the die attach pad and leads, for instance, between the two tie rails, supported by tie bars. The tie bars support the die attach pad during manufacturing, and attach the die attach pad, which is suspended in the middle, to the tie rails. Once the semiconductor dies are attached to the die attach pad in the lead frame and molding is applied to the lead frame, they can then be cut into individual pieces or punched out of the lead frame, thus leaving a packaged semiconductor device. In this instance, the tie bars 107 support the source pad 108 during assembly.

FIG. 4 shows a cut-away view of the bottom-exposed source pad 108 of the packaged semiconductor 100 in the first embodiment. The source pad 108 has half-etching 116 around its perimeter to lock the molding material 103 to the device 100. The gate pad 109 and the drain pad 113 are not in direct contact with the source pad 108. The molding material 103 completely surrounds the edges of the source pad 108, with a surface of the source pad 108 exposed through the molding material 103, so that the source pad 108 is not directly in contact with the gate pad 109 and drain pad 113. The molding material 103 further partially covers the source leads 105, gate leads 104 and drain leads 106, so that the leads are exposed through the molding material 103. The tie bar 107, which is a remnant from the lead frame, is seen on the side closest to the drain pad 113 extending from the source pad 108. The gate pad 109 has a gate lead 104 extending from it and also has a half-etch 118. Again, the half-etch 118 is useful for locking the molding material 103 to the structure for proper packaging of the device.

Figure 5:
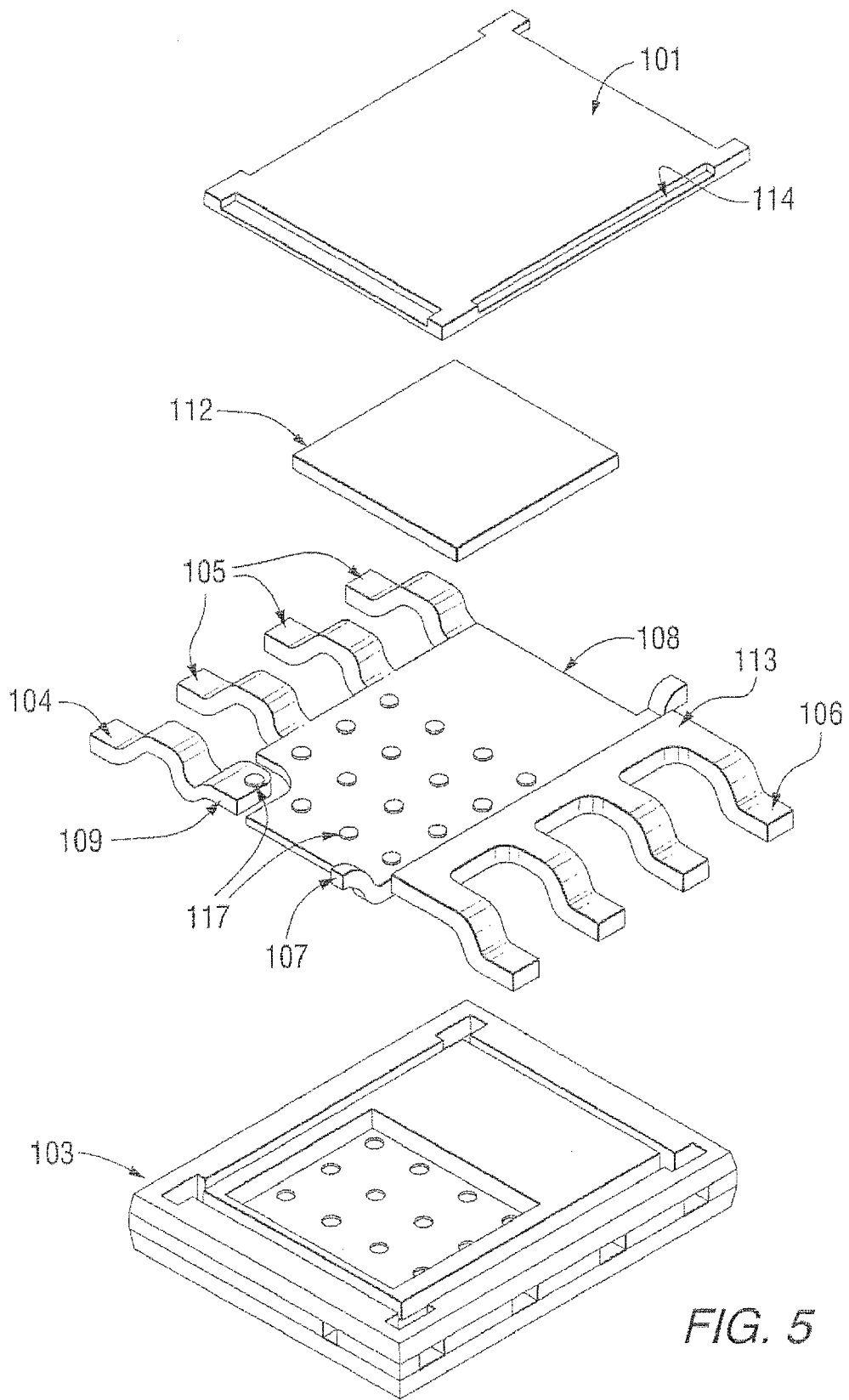
FIG. 5 shows an exploded view of the parts in the top-exposed thermal clip packaged semiconductor device.

FIG. 5 is an exploded view of the packaged semiconductor device from top to bottom, showing: the thermal clip 101 with a half-etch 114 around its perimeter; the flip chip 112 with the drain region facing the thermal clip 101; the source pad 109 with source leads 105 and with solder paste 117 to receive and attach the bumps on the source region of the flip chip 112; the gate pad 109 with a gate lead 104 and with solder paste 117 to receive and attach the gate bump on the flip chip 112 to the gate pad 109; the drain pad 113 with drain leads 106; and the molding material 103 to encapsulate the device.

Figure 6:
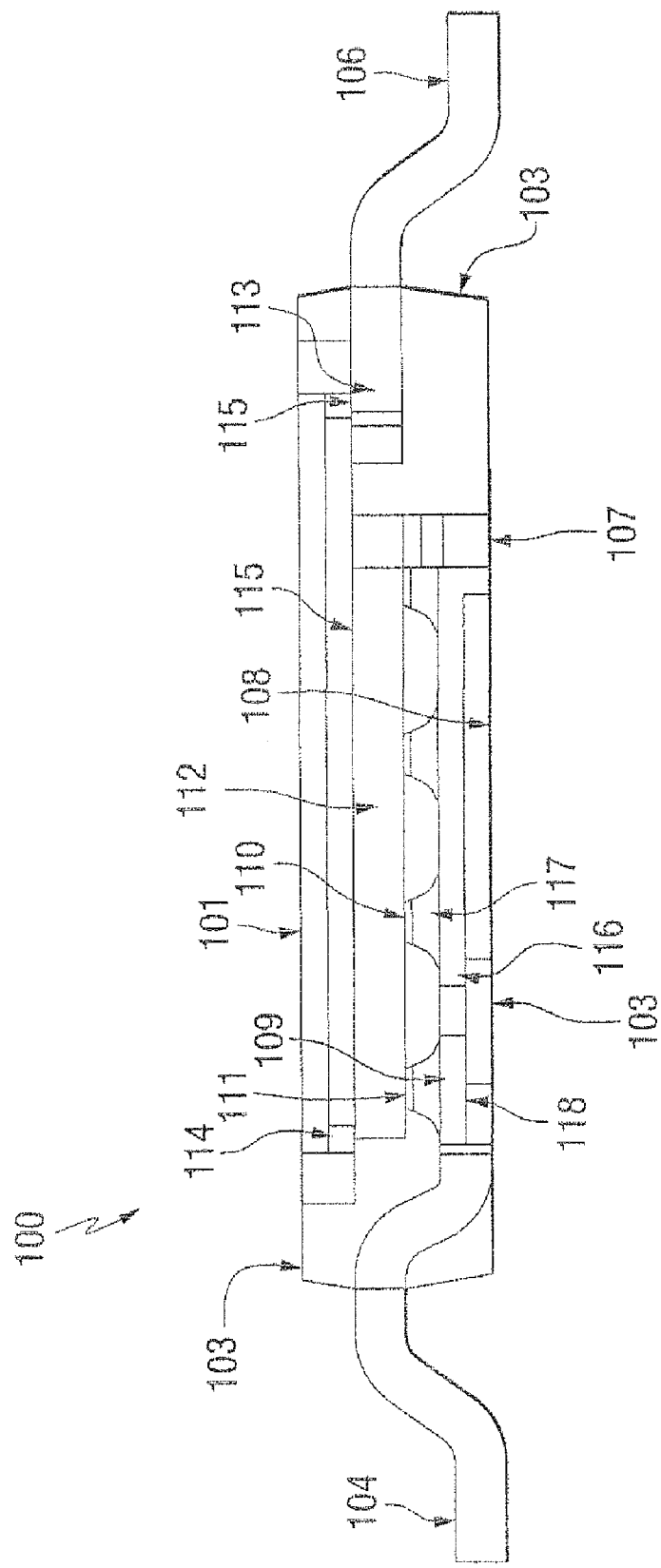
FIG. 6 shows a sectional view of the top-exposed thermal clip packaged device.

FIG. 6 is a sectional view of the packaged semiconductor device 100. Moving from the left to right, the gate lead 104 is shown as being partially covered by molding material 103. Looking at the gate pad 109, the half-etch 118 is observable as is the molding material 103 between the gate pad 109 and source pad 108, so that the two structures are electrically isolated. Also, the half-etch 116 around the perimeter of the source pad 108 is observable. On both the source pad 108 and gate pad 109 is solder paste 117, which connects the source bumps 110 and gate bump 111 protruding from the flip chip 112 to the source pad 108 and gate pad 109, respectively. The drain region of the flip chip 112 is attached to the thermal clip 101 by solder paste 115. The drain pad 113 is also attached to the thermal clip 101 by solder paste 115 on the same surface as the flip chip 112. The drain pad 113 and flip chip 112 are also electrically isolated by the molding material 112. The drain leads 106 extend through the molding material 103. The drain leads 106, source leads [not shown in this figure] and gate lead 104 are coplanar with the bottom-exposed source pad 108, thereby creating a footprint.

Figure 7:
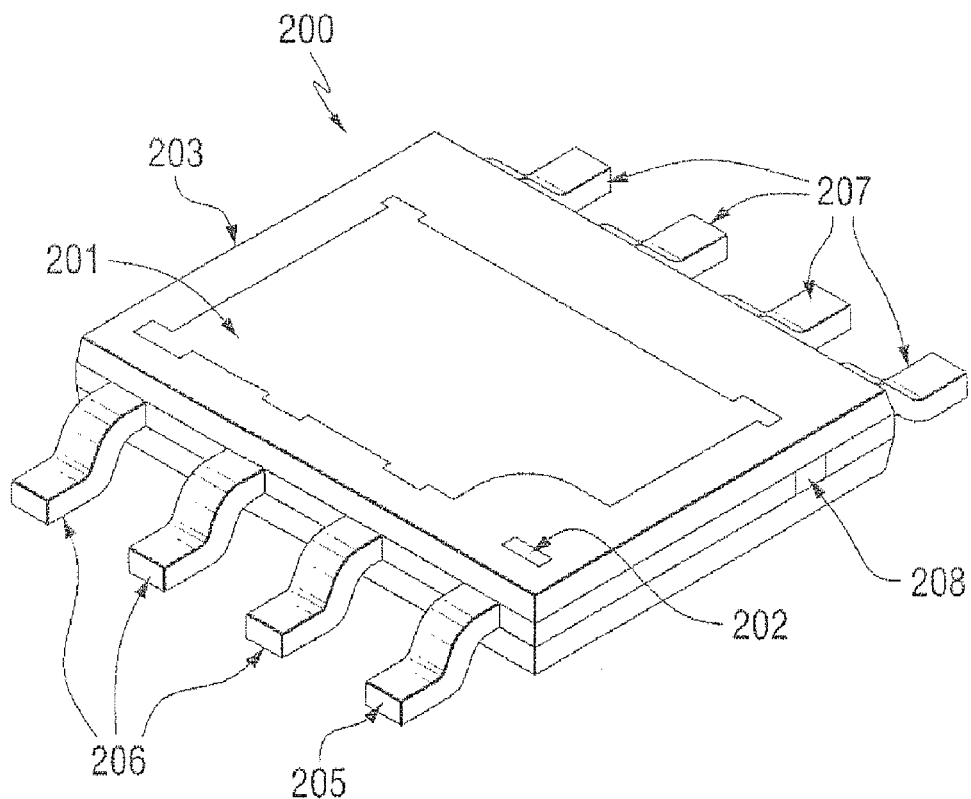
FIG. 7 shows a top perspective of a plan view of the top-exposed source pad packaged semiconductor device.
Figure 8:
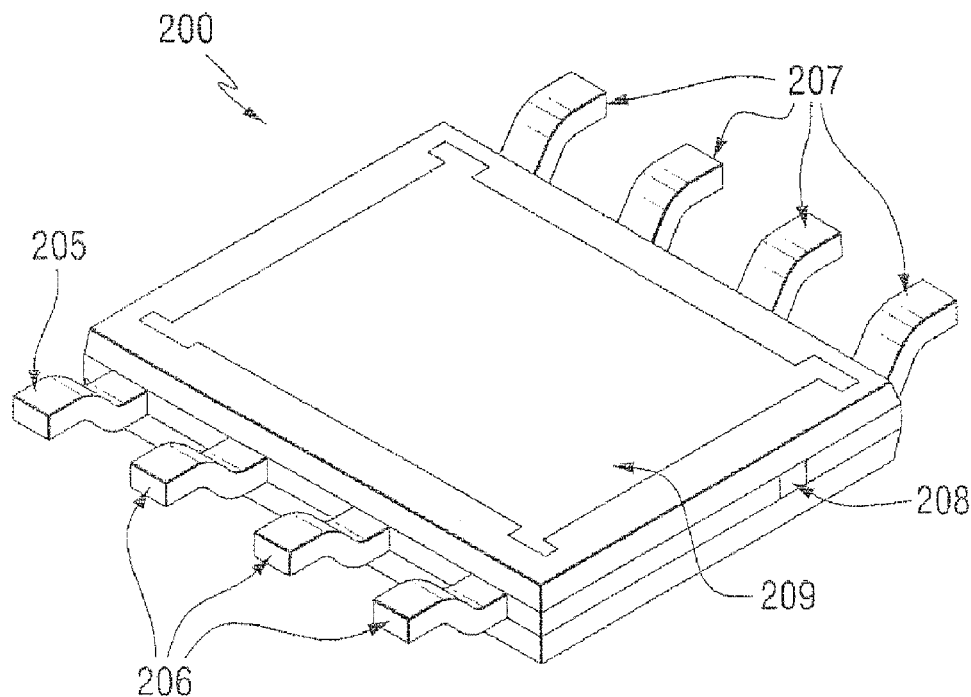
FIG. 8 shows a bottom perspective of a plan view of the top-exposed source pad packaged semiconductor device.

In a second embodiment, FIGS. 7 and 8 show a packaged semiconductor device 200 with a top-exposed source pad. FIG. 7 shows one surface of the source pad 201 exposed through the molding material 203. The gate pad 202 is also exposed through the molding material 203, but is covered by non-conductive ink. The gate lead 205, source leads 206 and drain leads 207 are exposed through the molding material 203. FIG. 8 shows the bottom side of the packaged semiconductor 200, with one surface of the thermal clip 209 exposed through the molding material 203. The gate lead 205, source leads 206 and drain leads 207 are coplanar with the thermal clip 209, thereby creating a footprint.

Figure 9:
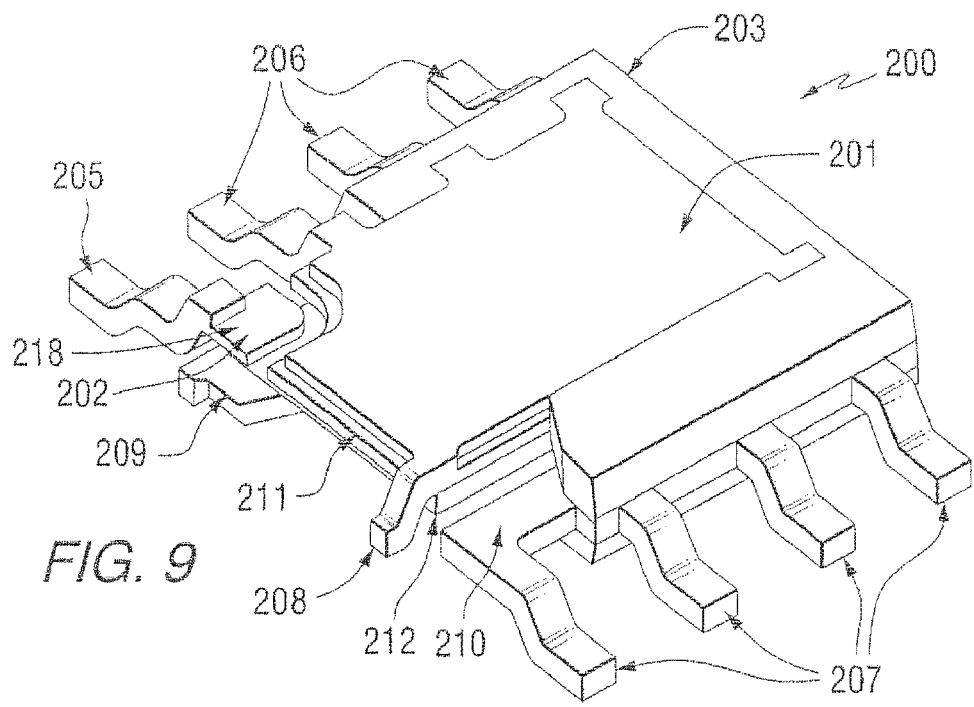
FIG. 9. shows a top view of the top-exposed source pad packaged semiconductor device with the molding partially removed.
Figure 10:
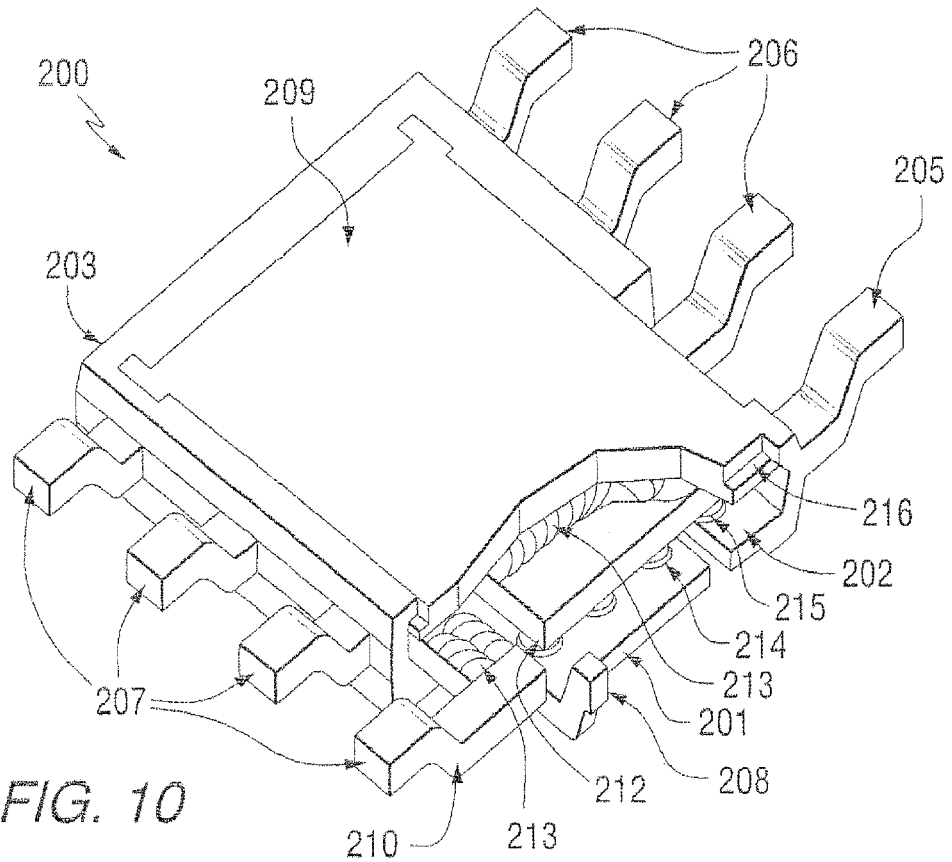
FIG. 10 shows a bottom view of the top-exposed source pad packaged semiconductor device with the molding material and thermal clip partially removed exposing the semiconductor die.

FIGS. 9 and 10 are cut-away views of the second embodiment from the top and bottom perspectives. Referring to FIG. 9, the half-etch 211 feature is observable around the source pad 201 for locking the molding material 203 to the source pad 201. The source pad 201 has a tie bar 208 which is a remnant of the lead frame. The gate pad 202 has a half-etch 218 for locking the molding material 203 to the gate pad 202. The molding material 203 completely surrounds the source pad 201 so that there is no direct connection between the source pad 203 and either the gate pad 202 or the drain pad 210.

FIG. 10 shows the bottom view of the packaged semiconductor 200. The thermal clip 209 has half-etching 216 around the perimeter for locking the nonconductive molding material 203. Solder paste 213 adheres the drain pad 210 and flip chip 212 to the unexposed surface of the thermal clip 210. The flip chip 212 has a drain region on one side of the chip and has a gate and source region on the opposing side. The flip chip 212 has a gate bump 215 and source bumps 214 protruding from the respective gate and source region on the flip chip 212. These bumps 214, 215 connect the flip chip 212 to the source pad 201 and gate pad 202. The source leads 206, gate lead 205 and drain leads 207 are coplanar with the thermal clip 209.

Figure 11:
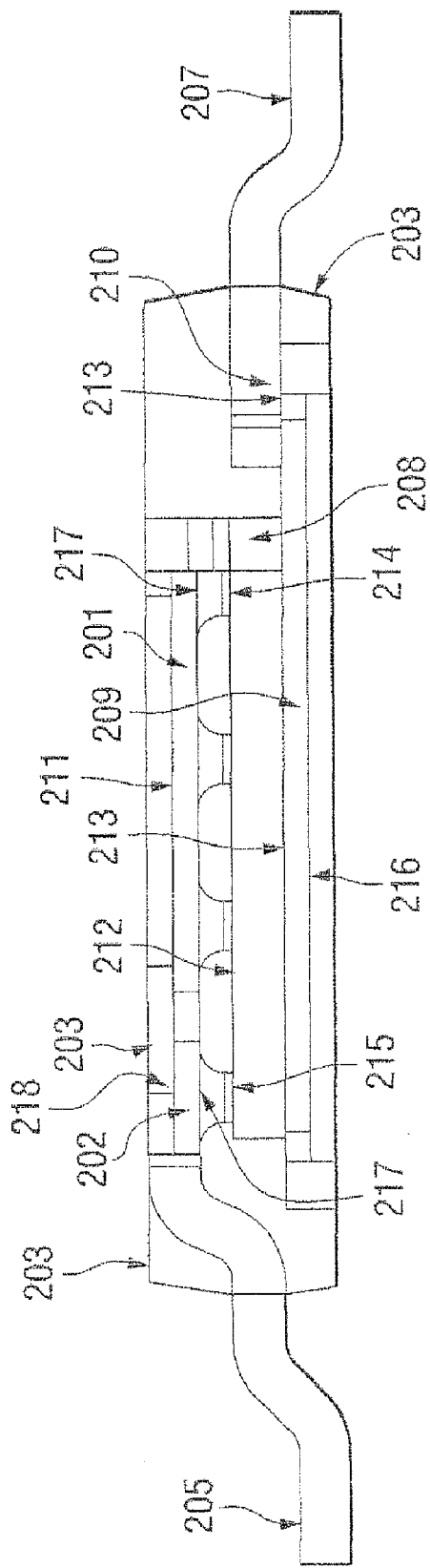
FIG. 11 shows a sectional view of the top-exposed source pad packaged device.

Referring to FIG. 11 shows a sectional view into the semiconductor device 200. The gate lead 205 and source lead [not shown in this figure] are coplanar with the thermal clip 209. The gate lead 205 is partially covered by the nonconductive molding material 203. The gate pad 202 is covered by the molding material 203, isolating it from the source pad 201. The gate pad 203 and source pad 201 have solder paste 217, which connects the gate bump 215 and source bumps 214 protruding from the flip chip 212 to the gate pad 202 and source pad 201, respectively. On the opposing side of the flip chip 212 is solder paste 213 attaching the flip chip 112 to the thermal clip 209. The drain pad 210 is also attached to the thermal clip 209 by solder paste 213. The molding material 203 separates the drain pad 210 from the flip chip 212, and also partially covers the drain leads 207. The drain leads 207 are coplanar with the thermal clip 209.

Figure 12:
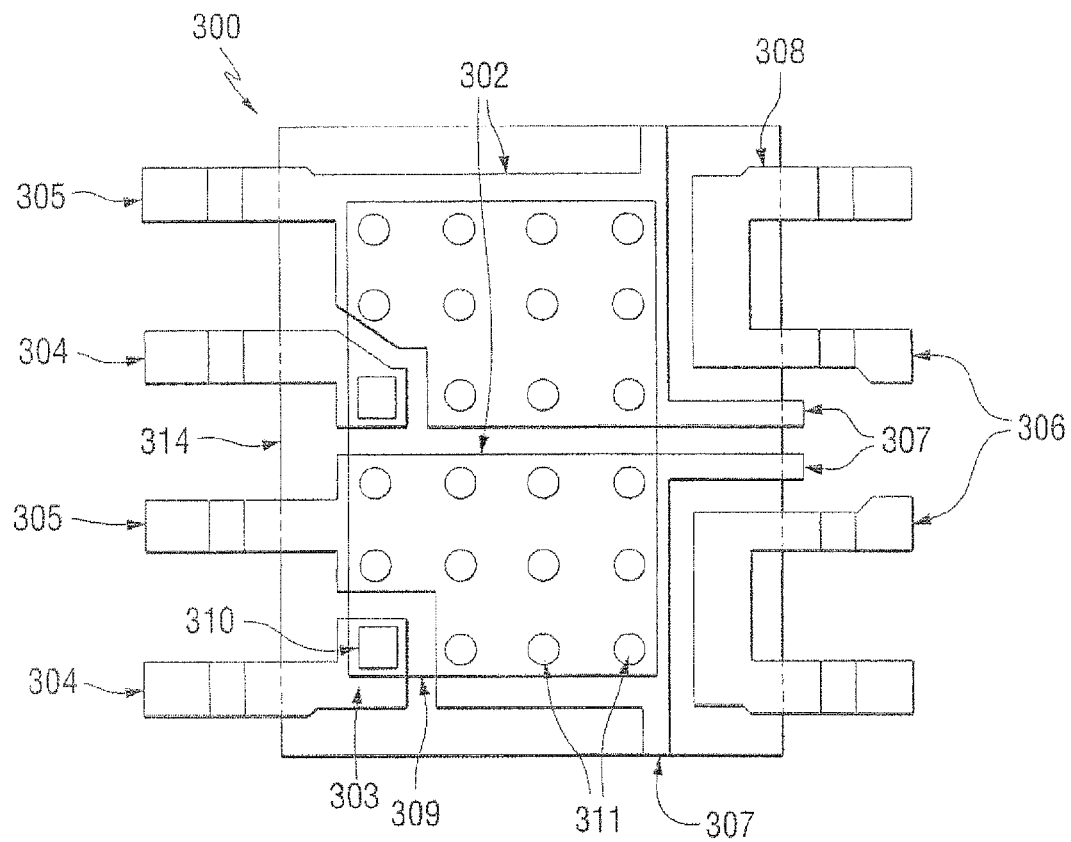
FIG. 12 shows a top perspective of a schematic of a top-exposed source pad packaged semiconductor with a die having multiple source and gate regions.
Figure 12A:
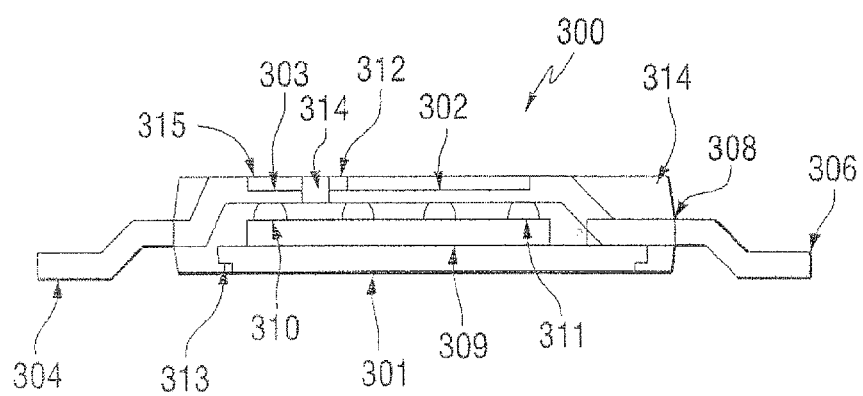
FIG. 12a shows a sectional view of a schematic of a top-exposed source pad packaged semiconductor with a die having multiple source and gate regions.
Figure 13:
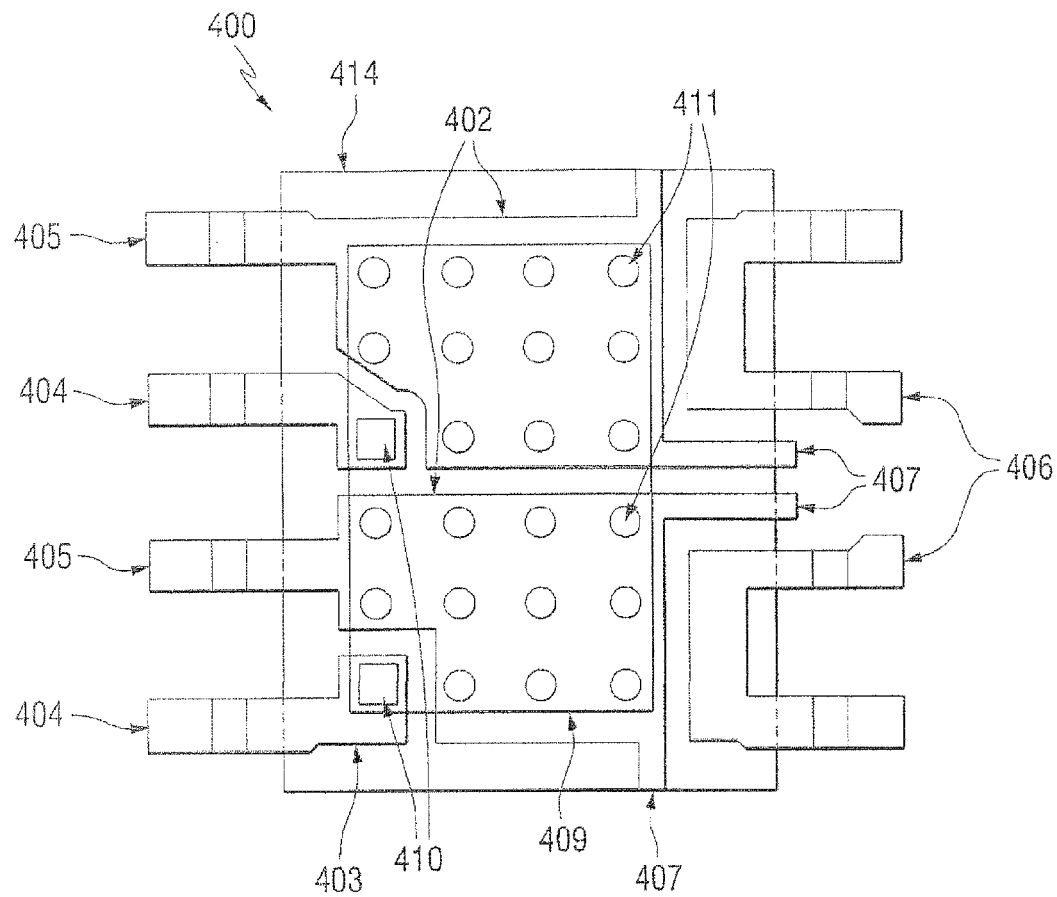
FIG. 13 shows a top perspective of a schematic of a top-exposed thermal clip packaged semiconductor with a die having multiple source and gate regions.
Figure 13A:
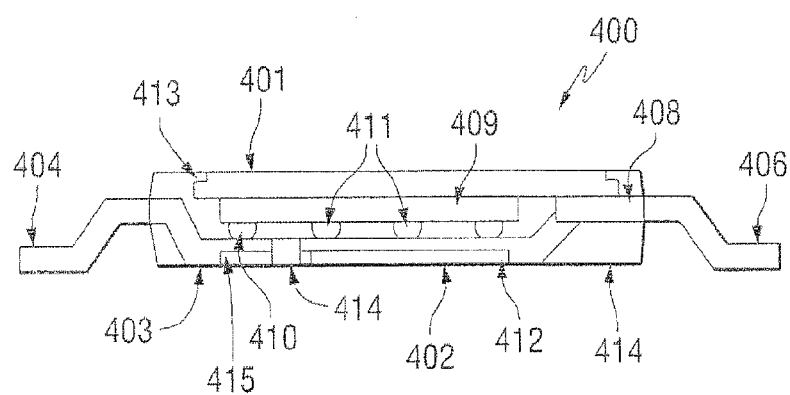
FIG. 13a shows a sectional view of a schematic of a top-exposed thermal clip packaged semiconductor with a die having multiple source and gate regions.

FIGS. 12, 12a, 13, and 13a show two other embodiments where the flip chip 309, 409 have multiple gate and source regions. Specifically, the flip chip 309, 409 have two gate regions and two source regions. FIGS. 12 and 12a show a top-exposed source pad packaged semiconductor 300 in a third embodiment, while FIGS. 13 and 13a show a top-exposed thermal clip packaged semiconductor 400 in a fourth embodiment.

FIGS. 12 and 12a show the gate leads 304 extending from the gate pad 303 through the nonconductive molding material 314. Similarly, the source leads 305 extend from the source pad 302 through the nonconductive molding material 314. The source pad 302 is exposed through the molding material 314. The source leads 305 and gate leads 304 are in a step-shape, so that they are coplanar with the thermal clip 301. The footprint created in the device 300 is the same as the footprint created in the second embodiment. The thermal clip 301 has a bottom-exposed surface through the molding material 314, and has a half-etch 313 to lock the molding material 314. The flip chip 309 and drain pad 308 are attached to the thermal clip 301 by solder paste. The flip chip 309 is connected to the source pad 302 and gate pad 303 by solder paste which holds and receives the source bumps 311 and gate bumps 310, respectively. The gate pad 303 and source pad 302 are separated by molding material 314, and the source pads 302 have a half-etch 312 around the perimeter for locking the molding material 314. The half-etch 315 in the gate pad 303 is also observable from the perspective in FIG. 12a. Further, the source pads 302 have tie bars 307 that are remnants of the lead frame used in manufacturing. These tie bars 307 separate the two drain pads 308 and extend through the molding material 314.

FIGS. 13 and 13a show a top-exposed thermal clip 401 and a bottom-exposed source pad 402 with a flip chip 404 with two gate regions and source regions to correspond to the two gate pads 403, source pads 402 and drain pads 405. The source leads 406 and gate leads 407 are in a gull-wing shape so that they are coplanar with the source pad 402 and drain leads 406. The footprint created in this device is the same as that of the first embodiment. The source leads 406, gate leads 407 and drain leads 406 are coplanar with the source pad 402. The features of the semiconductor device 400 are similar to the semiconductor device 300 in FIGS. 12 and 12a, except that the thermal clip 301 is top-exposed with a bottom-exposed source pad 302, whereas the thermal clip 401 and source pads 402 in FIGS. 13 and 13a are in opposite locations.

FIG. 14 shows a process for manufacturing the packaged semiconductor device. The method of manufacture is the same for the different embodiments but will vary with respect to the number or types of semiconductor dies used as well as the number and type of source, drain and gate structures (i.e. structures containing both the pad and the leads). Solder paste is dispensed on the surface of the thermal clip, which is in an array format, and the drain region of the semiconductor die is attached to the thermal clip (Step 501, 502). The thermal clip with the attached die is then singulated (Step 503). The lead frame is then prepared by dispensing solder paste to the areas where the source pad and gate pad will receive the source and gate bumps on the semiconductor die (Step 504). The paste is simultaneously dispensed on the drain pad for attachment to the thermal clip (Step 504). The thermal clip with the die is then attached to the lead frame (Step 505). A reflow process is used to finally bond: (1) the thermal clip and die, (2) the thermal clip and drain pad, (3) the gate pad and gate bump, and (4) the source pad and source bumps [not shown].

After the reflow process, the device is then packaged by applying a nonconductive molding material to encapsulate the device, leaving the thermal clip, source pad, and gate, source and drain leads exposed through the molding material (Step 506). Methods of molding the device are known to one skilled in the art. The packaged device can then be marked (Step 507). After marking the device, it is trimmed and formed (Step 508). The device is then singulated by any method known in the art, such as sawing, whereby the gate, source and drain pads are all disconnected from the lead frame array and the tie bars are cut from the tie rails connecting the lead frame arrays (Step 509). The resulting product is a packaged semiconductor device with dual exposed surfaces and leads coplanar with the bottom-exposed surface.

The foregoing embodiments have been described in connection with a vertical mosfet transistor. However those skilled in the art understand that other transistors and devices may be substituted. For example, a vertical bipolar transistor could be substituted for the mosfet with emitter regions and contacts corresponding to the source regions and contacts, a base region and contact corresponding to the gate region and contacts, and a collector region and contact corresponding to the drain region and drain contact.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

REFERENCE LIST

100—Top-Exposed Thermal Clip Packaged Semiconductor
101—Thermal Clip
103—Molding Material
104—Gate Lead
105—Source Leads
106—Drain Leads
107—Tie Bar
108—Source Pad
109—Gate Pad
110—Source Bumps
111—Gate Bumps
112—Flip Chip
113—Drain Pad
114—Half-Etch around Thermal Clip
115—Solder Paste to Attach Thermal Clip and Drain Pad to Flip Chip
116—Half-Etch around Source Pad
117—Solder Paste to Attach Source Pad and Gate Pad to Flip Chip
118—Half-Etch around Gate Pad
200—Top-Exposed Source Pad Semiconductor
201—Source Pad 202—Gate Pad
203—Molding Material
205—Gate Lead
206—Source Lead
207—Drain Lead
208—Tie Bar
209—Thermal Clip
210—Drain Pad
211—Half-Etch around Source Pad
212—Flip Chip
213—Solder Paste to Attach Thermal Clip and Drain Pad to Flip Chip
214—Source Bumps
215—Gate Bumps
216—Half-Etch around Thermal Clip
217—Solder Paste to Attach Gate Pad and Source Pad to Flip Chip
218—Half-Etch around Gate Pad
300—Top-Exposed Source Pads Packaged Semiconductor with Flip Chip Having Multiple Source and Gate Regions
301—Thermal Clip
302—Source Pad
303—Gate Pad
304—Gate Leads
305—Source Leads
306—Drain Leads
307—Tie Bar
308—Drain Pad
309—Flip Chip
310—Gate Bumps
311—Source Bumps
312—Half-Etch around Source Pad
313—Half-Etch around Thermal Clip
314—Molding Material
315—Half-Etch around Gate Pad
400—Top-Exposed Thermal Clip Packaged Semiconductor with Flip Chip Having Multiple Source and Gate Regions
401—Thermal Clip
402—Source Pad
403—Gate Pad
404—Gate Leads
405—Source Leads
406—Drain Leads
407—Tie Bar
408—Drain Pad
409—Flip Chip
410—Gate Bumps
411—Source Bumps
412—Half-Etch around Source Pad
413—Half-Etch around Thermal Clip
414—Molding Material
415—Half-Etch around Gate Pad
Step 501—Solder Paste Dispensed onto Thermal Clip and Drain Region of Semiconductor Die
Step 502—Flip Chip Attached to Thermal Clip
Step 503—Thermal Clip Singulated
Step 504—Solder Paste Dispensed onto Lead Frame
Step 505—Semiconductor Die and Thermal Clip Attached to Lead Frame
Step 506—Molding Material Encapsulation
Step 507—Marking of Packaged Device
Step 508—Trimming and Forming of Packaged Device
Step 509—Packaged Device Singulated

What is claimed is:

1. A molded gull wing leaded packaged semiconductor device comprising:

a. at least one semiconductor die comprising a vertical transistor having at least one control region and at least one first terminal region, and a second terminal region;
   b. a thermal clip with a first surface and a second surface wherein said second surface of said thermal clip is entirely disposed in one plane and is connected to said second terminal region of said semiconductor die;
   c. at least one first terminal pad structure with a first surface, a second surface, and at least one first terminal gull wing lead extending from one side of said first terminal pad structure, wherein said first terminal region of said semiconductor die is connected to said first surface of said first terminal pad structure;
   d. at least one control pad structure with a first surface, a second surface, and at least one control gull wing lead extending from one end of said control pad structure, wherein said control region of said semiconductor die is connected to said first surface of said control pad structure;
   e. at least one second terminal pad structure with a first surface, a second surface, and at least one second terminal gull wing lead extending from one end of said second terminal lead pad structure, wherein said first surface of said second terminal pad is connected to said second surface of said thermal clip; and
   f. a nonconductive molding material encapsulating said semiconductor die, wherein said first surface of said thermal clip and said second surface of said first terminal pad structure are exposed through said nonconductive molding material, and wherein said control gull wing lead, said first terminal gull wing lead and said second terminal gull wing lead are exposed through said nonconductive molding material.

2. The device of claim 1 wherein said first surface of said thermal clip is top-exposed through said molding material and said second surface of said first terminal pad structure is bottom-exposed through said molding material.

3. The device of claim 2 wherein said control lead, said first terminal lead and said second terminal lead are coplanar to said bottom-exposed second surface of said first terminal pad structure.

4. The device of claim 1 wherein said second surface of said first terminal pad structure is top-exposed through said molding material and said first surface of said thermal clip is bottom-exposed through said molding material.

5. The device of claim 4 wherein said control lead, said first terminal lead, and said second terminal lead are coplanar to said bottom-exposed first surface of said thermal clip.

6. The device of claim 1 wherein said semiconductor die is a mosfet and said first terminal region is a source region, said control region is a gate region, said second terminal region is a drain region, and wherein said first terminal pad structure and lead are a source pad and lead, said control pad structure and lead are a gate pad and lead, and said second terminal pad structure and lead are a drain pad and lead.

7. The device of claim 1 wherein said semiconductor die is a bipolar transistor and said first terminal region is an emitter region, said control region is a base region, and said second terminal region is a collector region, and wherein said first terminal pad structure and lead are an emitter pad and lead, said control pad structure and lead are a base pad and lead, and said second terminal pad structure and lead are a collector pad and lead.

* * * * *

UNITED STATES PATENT AND TRADEMARK OFFICE
CERTIFICATE OF CORRECTION

PATENT NO. : 7,576,429 B2
APPLICATION NO. : 11/364399
DATED : August 18, 2009
INVENTOR(S) : Madrid et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 348 days.

Signed and Sealed this

Seventh Day of September, 2010

David J. Kappos
*Director of the United States Patent and Trademark Office*